United States Patent [19]

George

[11] Patent Number: 5,119,019
[45] Date of Patent: Jun. 2, 1992

[54] AUTOMATIC FUNCTION SELECTING MULTIMETER

[75] Inventor: Richard E. George, Everett, Wash.

[73] Assignee: John Fluke Mfg. Co., Inc., Everett, Wash.

[21] Appl. No.: 442,243

[22] Filed: Nov. 28, 1989

[51] Int. Cl.$^5$ .............................................. G01R 15/08
[52] U.S. Cl. ...................................... 324/115; 364/483
[58] Field of Search .................. 324/115, 99 D, 133; 364/483; 341/155

[56] References Cited

U.S. PATENT DOCUMENTS

| | | | |
|---|---|---|---|
| 2,870,408 | 1/1959 | Draganjac | 324/115 |
| 3,790,886 | 2/1974 | Kurtin et al. | 324/99 D |
| 4,001,683 | 1/1977 | McNeilly | 324/115 |
| 4,105,967 | 8/1978 | Macemon | 324/115 |
| 4,329,641 | 5/1982 | Ikeda et al. | 324/115 |
| 4,540,974 | 9/1985 | Schanne et al. | 324/115 |
| 4,825,150 | 4/1989 | Sirasud | 324/133 |

Primary Examiner—Ernest F. Karlsen
Attorney, Agent, or Firm—Richard A. Koske; Robert E. LeBlanc

[57] ABSTRACT

Disclosed is a digital multimeter having an automatic function selection capability. The device includes a sensing circuit connected to its input to respond to the type of analog signal which is sensed and to provide logic signals which are characteristic thereof. These logic signals may be utilized to cause generation of encoding signals to encode and dispose the converter circuit to perform the desired conversion function and provide the desired display as a function of the analog input. The device may include an internal reference signal source such as a DC reference potential and the sensing circuit may sense a differential between such reference source and the external analog signal to make a determination to utilize or disconnect the reference signal source in performing the function dictated by the nature of the analog signal.

24 Claims, 3 Drawing Sheets

ENCODER LOGIC FOR EMBODIMENT WHERE AF ENCOMPASSES OHMS, VOLTS AC, AND VOLTS DC:

$$\text{OHMS} = \text{AF} \cdot \bar{N} \cdot \bar{P} + \Omega \cdot \overline{B0} + \overline{B1} + B2$$

$$\text{VAC} = \text{AF} \cdot N \cdot P + \tilde{V} \cdot B0 + B1 + B2$$

$$\text{VDC} = \text{AF} \cdot (N \cdot \bar{P} + \bar{N} \cdot P) + \overline{\tilde{V}} \cdot \overline{B0} + B1 + B2$$

FIG. 5A

ENCODER LOGIC FOR EMBODIMENT WHERE AF ENCOMPASSES DIODE TEST, VOLTS AC, AND VOLTS DC:

$$\text{DIODE TEST} = \text{AF} \cdot \bar{N} \cdot \bar{P} + \text{⯈⊢} \cdot B0 + \overline{B1} + \overline{B2}$$

$$\text{VAC} = \text{AF} \cdot N \cdot P + \tilde{V} \cdot B0 + B1 + B2$$

$$\text{VDC} = \text{AF} \cdot (N \cdot \bar{P} + \bar{N} \cdot P) + \overline{\tilde{V}} \cdot \overline{B0} + B1 + B2$$

FIG. 5B

AUTOMATIC FUNCTION SELECTING MULTIMETER

FIELD OF THE INVENTION

The present invention pertains generally to digital multimeters capable of performing multiple functions such as measurement of voltage, resistance and current and performing continuity and diode tests, and more particularly, to a multimeter having an automatic function selection capability.

BACKGROUND OF THE INVENTION

There are presently available a variety of digital multimeters capable of providing digital indications or measurements of multiple parameters such as DC or AC voltage, resistance, diode characteristic and circuit continuity by way of example. Many of such instruments are provided with automatic range selection and automatic polarity indication. The particular function to be performed by the instrument is generally selected by a function selector switch which is manually preset to enable the instrument to perform the selected function and provide the desired indication.

SUMMARY OF THE INVENTION

The present invention provides an improved digital multimeter in which function selection is automatic for multiple functions. Such automatic function selection may be combined with automatic range selection and automatic polarity indication. It is accordingly an object of the invention to provide an improved digital multimeter capable of performing an automatic function selection wherein the nature of the parameter being sensed automatically actuates circuitry in the instrument to dispose the conversion circuitry to perform the appropriate function. Thus voltage may be measured without manual selection of AC or DC voltage functions and without manual selection of the appropriate range. Resistance measurement may be attempted without preliminarily establishing that the circuit or component to be measured is de-energized. If such is not the case and an external voltage exists across the sensed contact points the instrument of the invention will automatically exit the ohms function, establish the appropriate voltage configuration and indicate the value of such voltage whether it be alternating or direct. If desired the circuit under investigation may then be de-energized to permit resistance measurement.

The invention may be implemented in an effective and cost efficient manner by utilizing combined logic with the conversion and display circuitry of prior art instruments. According to the invention a digital multimeter containing an analog-to-digital converter circuit which may be manually encoded by a selector switch to selectively measure AC or DC voltages or resistance may be provided with automatic function selection circuitry to sense the signal appearing at the multimeter and provide encoding signals to the A/D converter circuitry to encode that circuitry for performing the desired function. A sensing circuit may be connected to the input to respond to the type of analog signal which is sensed and to provide logic signals which may be established to be characteristic of such type signal. These logic signals then may be utilized to cause generation of encoding signals to encode and dispose the converter circuit to perform the desired function and provide the desired display as a function of the unknown analog input. The device may include an internal reference signal source such as a DC reference potential and the sensing circuit may sense a differential between such reference source and the external analog signal to make a determination to utilize or disconnect the reference signal source in performing the function dictated by the nature of the analog signal.

BRIEF DESCRIPTION OF THE DRAWINGS

FIGS. 5A and 5B illustrate the logic equations used to develop the encoding signals.

DESCRIPTION OF THE PREFERRED EMBODIMENT

Figure 1:
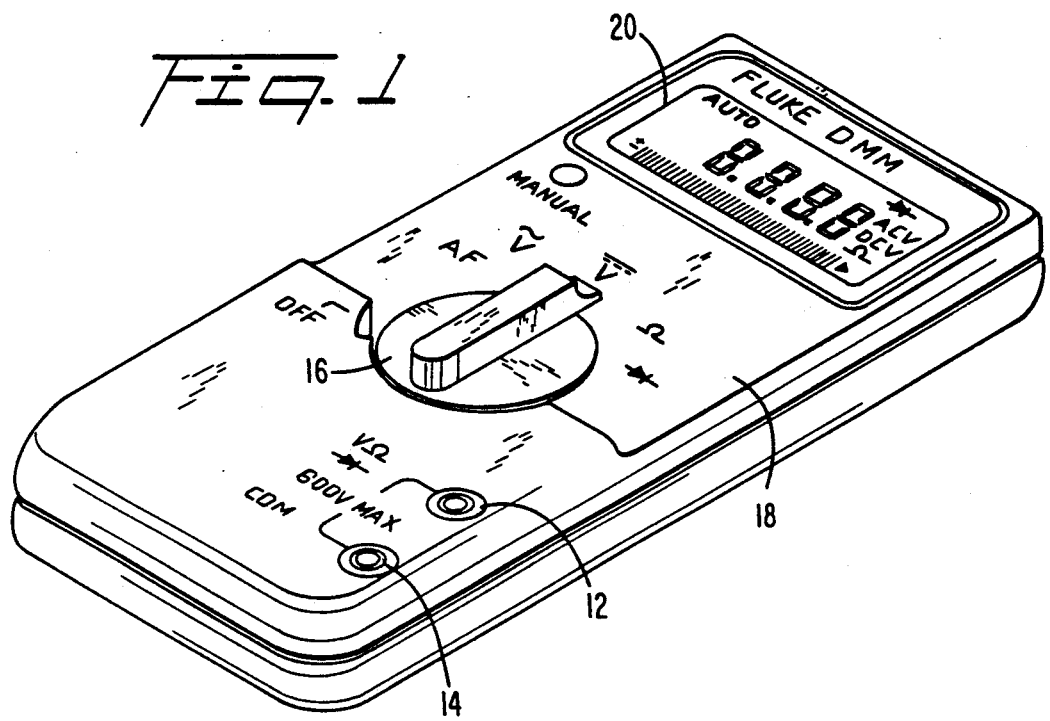
FIG. 1 is a perspective view of a digital multimeter constructed according to the invention.

Referring to FIG. 1 there is shown a representative Digital Multimeter having circuitry modified to incorporate and effectuate the automatic function selection capability of the present invention. By way of example, a prior art Multimeter typically employs comprises a dual slope analog-to-digital converter with auto ranging capabilities. Circuits used in such a multimeter are described in assignee's U.S. Pat. No. 4,556,867 issued Dec. 3, 1985, to Richard E. George, the applicant herein, and in assignee's U.S. Pat. No. 4,588,983 issued May 13, 1986, to Norman H. Strong. Prior art 70 Series Multimeters, as manufactured by assignee, utilize an AP75 analog-to-digital (A/D) converter chip.

Referring to FIG. 1 there is shown a portable hand-held multimeter 10 having input terminals 12 and 14. The terminal 12 having the "V" and ohm (Omega) symbol is the positive or high side input terminal for all functions. The terminal 14 bearing the "COM" designation is the negative, common or low input terminal for all measurement modes. A function selector switch 16 selects the function to be performed by the instrument. Such functions may include AC and DC voltage, resistance, continuity check, diode test, and the like. Attention is directed to the extreme counter-clockwise or left-hand position, labeled "AF". In accordance with the invention, this is an "Autofunction" position which provides for automatic transfer of measuring function depending on conditions detected from the circuit being measured. Suitable symbols 18 are provided to facilitate actuation of the function selector switch 16 to select the desired function.

A liquid crystal display 20 provides up to a 4 digit measurement data display and in this particular instrument also includes a bar graph display. The display includes in addition to the numerical readout and bar graph display suitable symbols to indicate the function which has been selected and the units of measurement as well as the polarity of DC voltages being sensed. In the conventional Fluke Series 70 Digital Multimeters the actuation of the function selector switch performs a switching function to encode the converter chip to perform the desired function and provide the appropriate display. Stated differently the function selector switch disposes the converter circuitry in an appropriate configuration to carry out the selected function.

Figure 2:
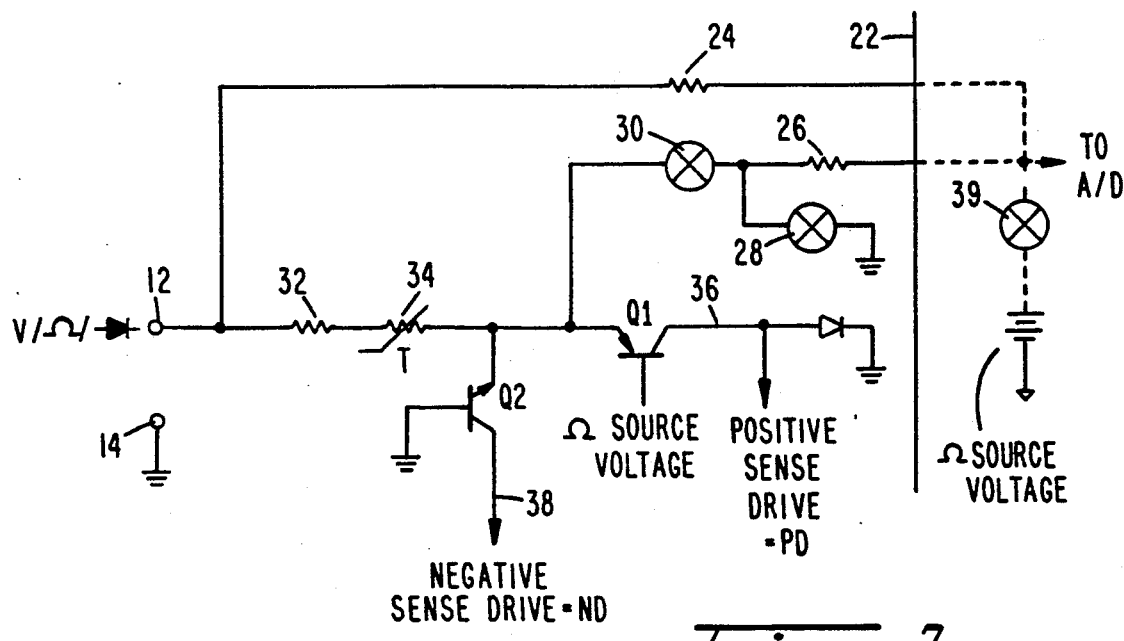
FIG. 2 is a simplified circuit diagram of the input circuitry of a preferred embodiment of a multimeter constructed according to the invention.

Referring to FIG. 2 there is shown a simplified version of the combination analog and logic circuitry incorporated in one embodiment of the invention. Referring to that figure the AP75 chip of the Series 70 Multimeter is indicated at 22 and the multimeter input terminals 12 and 14 of FIG. 1 are shown using the same reference numerals. As with the conventional 70 Series instrument in a voltage measuring configuration, a voltage to be measured is connected through a multimegohm resistor 24 and resistive network indicated at 26. A switch 28 is included in this instrument to connect the outer terminal of the resistor network 26 to ground when the instrument is disposed to perform the voltage measurement function. When the instrument is switched to the ohms or resistive measurement function the switch 28 is opened and switches 30 and 39 are closed responsive to the action of the function selector switch 16.

According to the arrangement of the invention illustrated in FIG. 2 the instrument may be connected for automatic function selection by placing the function selector switch 16 in the AF ("autofunction") measurement position. With test lead terminals open, switch 28 is open and switches 30 and 39 are closed, which, as previously described, enables the measurement of resistance. Resistor 32 and thermistor 34 are provided for protective purposes. Thermistor 34 is a positive temperature coefficient type which will automatically limit current drawn from a live voltage source connected between terminals 12 and 14 to a safe level. This current limiting is the result of self-heating of thermistor 34. With the instrument in the ohms measurement function condition the converter chip 22 is encoded from the signals at the PD and ND sense drive lines 36 and 38 into the appropriate configuration to perform that function and provide a resistance display. If the contact points or nodes to which the terminals 12 and 14 are connected have a live voltage thereon which exceeds the normal internal source voltage used in the multimeter to effect the resistance measurement then the devices of the invention generate one or more overvoltage signals via PD and/or ND which are connected to default the ohms encoding of the converter and change over to voltage encoding to permit voltage measurement. The voltage measured may be either AC or DC with the polarity of the DC voltage being immaterial inasmuch as the multimeter provides a polarity indication. If voltage is being measured, the meter display provides an indication of whether AC or DC is the dominant voltage.

Referring to FIG. 2 sense transistor Q1 has its base connected to the ohms measurement voltage source in the multimeter. This voltage is usually on the order of 1.5 volts. The emitter of transistor Q1 is connected to thermistor 34 and the collector is connected to the positive voltage logic circuit through lead 36. A negative voltage sense transistor Q2 has its emitter connected to the thermistor 34 and its collector connected through lead 38 to the negative voltage logic circuit to be described. The base of transistor Q2 is connected to ground.

Figure 3:
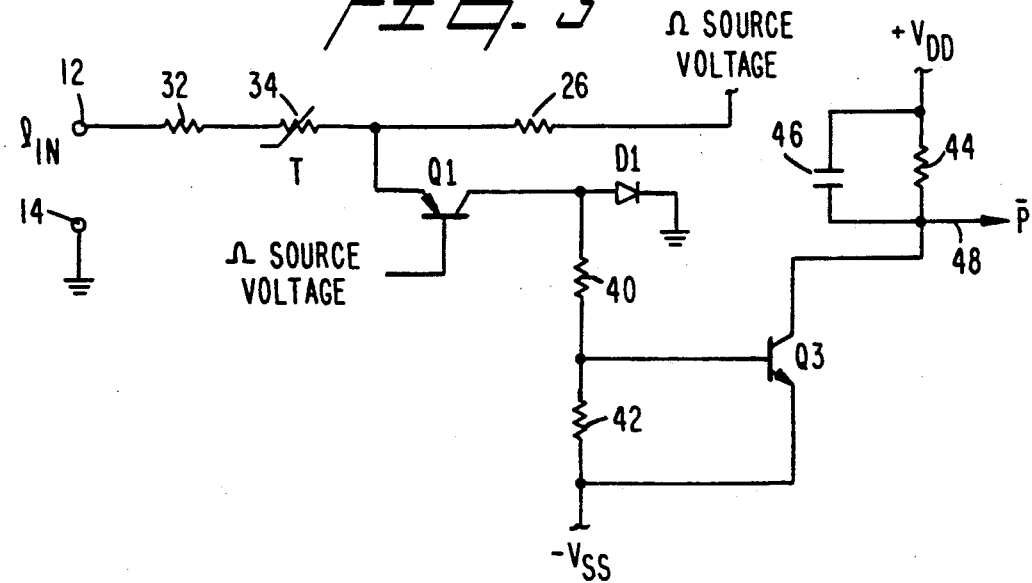
FIG. 3 illustrates details of the positive sense circuitry shown partially in FIG. 2.

Referring to FIG. 3 there is shown the positive voltage sense circuit. The terminals 12 and 14, resistor 32, thermistor 34 and network resistor 26 are the same as illustrated in FIG. 2. The switch 30 in FIG. 2 is closed in this condition of the meter as previously described and is not shown in the configuration of the circuit illustrated in FIG. 3. The collector of transistor Q1 is connected to the anode of diode D1 which has its cathode connected to ground. The anode of diode D1 is connected through serially connected resistors 40 and 42 to a negative voltage source $-V_{ss}$. The junction of the serially connected resistors 40 and 42 is connected to the base of transistor Q3 which has its emitter connected to the negative voltage source $-V_{ss}$. The collector of transistor Q3 is connected through resistor 44 to a positive voltage supply source $+V_{dd}$. A capacitor 46 is connected across the resistor 44. The lead 48 defines a positive voltage logic signal to cause the appropriate encoding of the converter, overriding the ohms measurement encoding to permit automatic function selection for voltage measurement.

Figure 4:
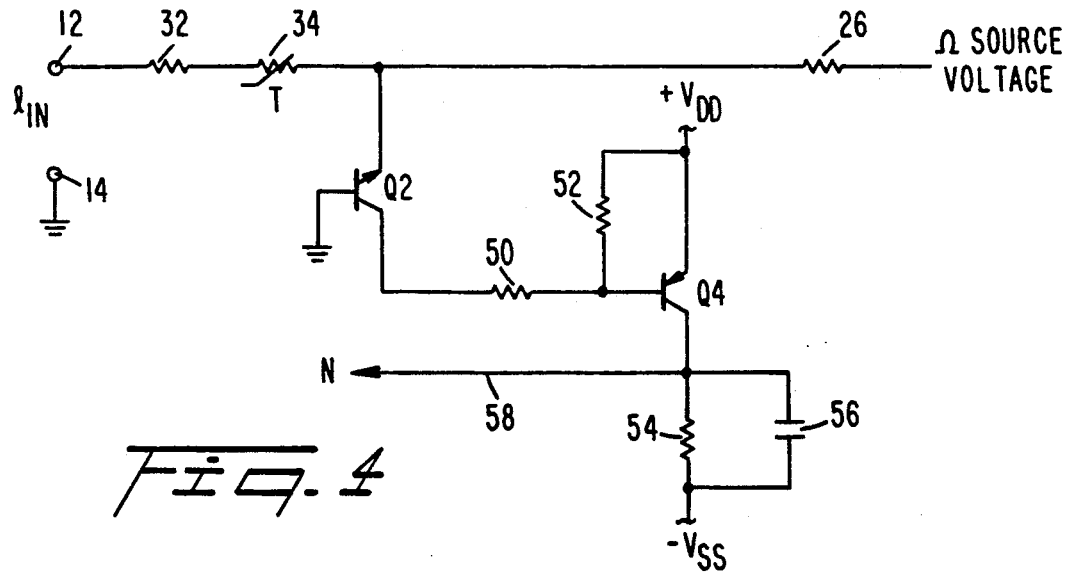
FIG. 4 illustrates details of the negative sense circuitry shown partially in FIG. 2.

FIG. 4 illustrates the negative voltage sense circuit and also illustrates the input terminals 12 and 14, input resistor 32, thermistor 34 and network resistor 26. Transistor Q2 has its collector connected through resistor 50 to the base of transistor Q4. The emitter of transistor Q4 is connected to the positive supply source $+V_{dd}$ and a resistor 52 is connected from the positive supply $+V_{dd}$ to the base of the transistor Q4. The collector of transistor Q4 is connected through resistor 54 to the negative voltage supply $-V_{ss}$ through resistor 54. Resistor 54 is connected in parallel with a capacitor 56. A negative voltage logic signal is provided on lead 58. The functioning of the voltage sense and logic circuits of FIGS. 3 and 4 will now be described. The voltage logic signals N and $\overline{P}$ are defined as positive true logic (N representing a signal of negative polarity with respect to common, and P representing a positive polarity signal with respect to common).

Referring to FIG. 3 it is assumed that the function selector switch of the multimeter is set to the AF measurement mode. If no external voltage appears at input terminals 12 and 14 the instrument will function in its conventional fashion to perform an ohms measurement based upon the ohms measurement encoding of the converter from logic signals $\overline{P}$ and N. If there should appear on the input terminals a positive external voltage in excess of the ohms measurement source voltage of approximately 1.5 volts, this external voltage will cause transistor Q1 to saturate or turn on and cause current to flow from terminal 12 through resistor 32, thermistor 34, transistor Q1 and diode D1. Current will also flow through series resistors 40 and 42 to the negative voltage source $-V_{ss}$. This will bias transistor Q3 to a saturated or on condition so that current also flows from the positive source $+V_{dd}$ through resistor 44 and transistor Q3 to the negative voltage source $-V_{ss}$. In this condition the logic lead 48 is at the potential of the negative supply voltage $-V_{ss}$.

If a positive voltage across the input terminals 12-14 is not in excess of the ohms measurement source voltage supplied to the base of transistor Q1 then that transistor does not conduct and transistor Q3 is not turned on. In this condition the logic lead 48 is at the potential of the positive voltage supply $+V_{dd}$.

Referring to FIG. 4, if a negative external voltage appears at the input terminal 12 the transistor Q2 is turned on and current flows through transistor Q2, resistor 50 and resistor 52 to the positive supply source $+V_{dd}$. This biases transistor Q4 on so that current also flows from the positive supply source $+V_{dd}$ through transistor Q4 to the negative supply source $-V_{ss}$ through resistor 54. In this condition the logic lead 58 has thereon a signal at the potential of the positive supply source $+V_{dd}$. If there is no external negative voltage on input terminal 12 then transistor Q2 is non-conductive and transistor Q4 also remains off. Under these conditions the signal on the logic lead 58 is at the potential of the negative supply $-V_{ss}$.

If an external AC voltage appears at the input terminals both the positive and the negative sense circuits of FIGS. 3 and 4 provide voltage indications on their logic leads 48 and 58 through the operation of the resistor capacitor circuits 44-46 in FIG. 3 and 54-56 in FIG. 4. These circuits are similar and may typically be designed to provide a 0.1 second time constant to hold AC peaks. Whereas those circuits are drawn as analog time constant circuits, it should be noted that digital processing techniques can optionally provide for equivalent time constant logic signals. Thus when an AC signal is detected at the terminals 12-14 a logic signal of $-V_{ss}$ will appear on logic lead 48 and a signal of $+V_{dd}$ will appear on logic lead 58. This combination of logic signals is arranged to cause the converter to be encoded to perform its AC measurement function.

As described previously the 70 Series Fluke Multimeter converter circuit is encoded to an appropriate circuit configuration to perform its multiple functions by the manual function selector switch. The same is true of other conventional digital multimeters. The operation of the selector switch establishes conditions in the Series 70 converter as indicated in the following truth table:

| FUNCTION | B0 | B1 | B2 |
| --- | --- | --- | --- |
| ACV | 1 | 1 | 1 |
| DCV | 0 | 1 | 1 |
| Ohms | 0 | 0 | 1 |
| Diode Test | 1 | 0 | 0 |

The designations B0, B1 and B2 indicate connection points or nodes in the 70 Series multimeter controlled by the manual function selector switch and the truth table shows the necessary logic levels at such connection points in order to encode or dispose the converter circuit into the appropriate configuration to measure AC volts, DC volts, ohms and diode test. According to the invention it is possible to additionally implement automatic function selection either for ohms and voltage (AC or DC) or for diode test and voltage (AC or DC).

Figure 6:
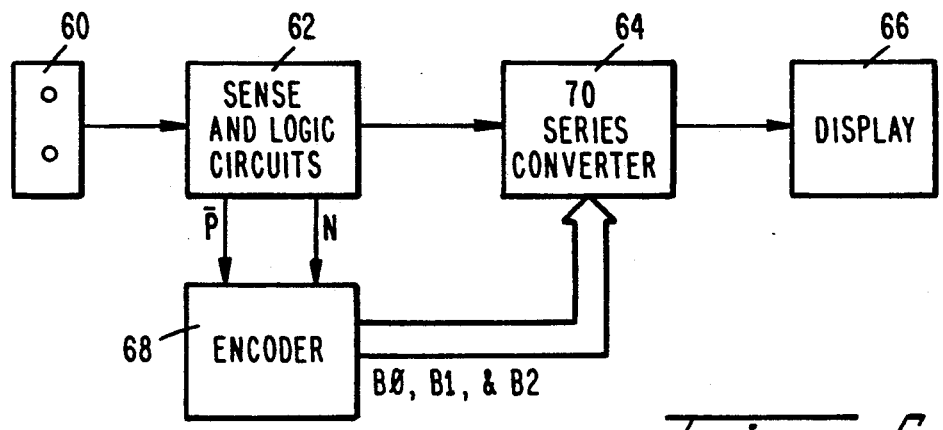
FIG. 6 is a block diagram of a digital multimeter constructed according to the invention.

The logic equations used to develop the B0, B1 and B2 encoding signals from the positive and negative logic signals on leads 48 and 58 and the function selector switch positions AF, $\overline{V}$, $\widetilde{V}$, $\Omega$, and →+ are set forth in FIG. 5 of the drawings. This is further illustrated in FIG. 6 of the drawings wherein the input terminals are indicated at 60. The positive and negative overload circuits are indicated at 62 and the 70 Series converter is indicated at 64 with its display at 66. The logic equations of FIG. 5 are performed by a suitable encoder 68 which receives the positive ($\overline{P}$) and negative (N) logic signals from the sense circuitry 62.

An improved multimeter incorporating the automatic function selection feature of this invention may be conveniently used as follows: If it is desired to measure a circuit with unknown parameters the selector switch may be set to the AF position and the test leads or input terminals applied to the points or nodes where a measurement is desired. If a live voltage exists at those points the sense and logic circuits 62 will provide appropriate signals to the encoder 68 which in turn will encode the converter 64 for measurement of AC or DC volts as indicated by the sense circuits. If there is not a live voltage present (live voltage being defined as one which is of sufficient magnitude to energize either of the sense drive circuits), then a measurement of resistance (or alternately, diode test) will be displayed. The instrument may also be manually switched to the VAC, VDC, ohms or diode test measurement function by the selector switch if desired. Although the present invention has been described and illustrated in detail, it is to be understood that the same is by way of illustration and example only and is not to be taken by way of limitation, the spirit and scope of the present invention being limited only by the terms of the appended claims.

What I claim is:

1. A circuit for processing multiple types of external analog signals applied to an input terminal of said circuit comprising:

a signal processing circuit coupled to said input terminal and capable of being configured to perform multiple processing functions on said external analog signals;

control means for sensing the value of said external analog signal and generating control signals that are a function of said external analog signal value; and encoding means responsive to said control signals for generating encoding signals and applying said encoding signals to said signal processing circuit so as to cause said signal processing circuit to assume a configuration to perform a predetermined function responsive to the external analog signal value.

2. A circuit according to claim 1 wherein said signal processing circuit includes an analog-to-digital converter circuit having internal reference signal means for generating a reference signal and wherein said control means senses a differential between the magnitude of said reference signal and the magnitude of said external analog signal.

3. A circuit according to claim 2 including switching means for disconnecting said reference signal means when the magnitude of said external analog signal is in excess of the magnitude of said reference signal.

4. A circuit according to claim 2 wherein said signal processing circuit performs a first signal processing function when said external analog signal is a DC signal and the magnitude is in excess of the magnitude of said reference signal and a second signal processing function when the magnitude of said external analog signal is not in excess of the magnitude of said reference signal.

5. A circuit according to claim 4 wherein said first signal processing function is responsive to said external analog signal and said second signal processing function is responsive to said reference signal and to the value of an external impedance connected to the input terminal of said circuit.

6. A circuit according to claim 4 wherein said signal processing circuit performs a third signal processing function when the magnitude of said external analog signal is in excess of the magnitude of said reference signal and when said external analog signal is an AC signal.

7. A circuit according to claim 1 wherein said signal processing circuit generates a first output signal responsive to the magnitude of said external analog signal and a second output signal indicative of the form of processing being applied to said external analog signal.

8. A circuit according to claim 1 including a positive temperature coefficient resistor connected between the input terminal of said circuit and said signal processing circuit.

9. A converter circuit for providing analog-to-digital conversion comprising:
   an analog input terminal for receiving multiple types of external analog signals;
   digital output means for outputting digital signals proportional to said external analog signals;
   sensing means connected to said analog input terminal and responsive to the type of said external analog signal applied to said analog input terminal for generating logic signals which are characteristic of the type of said external analog signal; and
   encoding means coupled to receive said logic signals and responsive to said logic signals for providing encoding signals to said converter circuit and causing said converter circuit to be encoded to respond to the type of external analog signal applied to said analog input terminal.

10. A converter circuit according to claim 9 including an internal reference signal means for producing a reference signal; said sensing means sensing a differential between said reference signal and said external analog signal applied to said analog input terminal.

11. A converter circuit according to claim 10 wherein said sensing means provides a first logic signal when the magnitude of said external analog signal applied to said analog input terminal exceeds the magnitude of said reference signal and when said external analog signal is a DC signal, a second logic signal when the magnitude of said external analog signal exceeds the magnitude of said reference signal and when said external analog signal is an AC signal, and a third logic signal when the magnitude of said external analog signal does not exceed the magnitude of said reference signal.

12. A converter circuit according to claim 9 including output means for outputting signals characteristic of said encoding signals.

13. A converter circuit for providing analog-to-digital conversion comprising:
   an analog input terminal for receiving multiple types of external analog signals;
   digital output means for outputting digital signals proportional to said external analog signals;
   display means for displaying said digital signals;
   sensing means connected to said analog input terminal and responsive to the type of said external analog signal applied to said analog input terminal for providing logic signals which are characteristic of the type of said external analog signal applied to said analog input terminal; and
   encoding means responsive to said logic signals for providing encoding signals to said converter circuit and causing said converter circuit to be encoded to respond to the type of said external analog signal applied to said analog input terminal and to cause said display means to display an output proportional to said external analog input signal.

14. A converter circuit according to claim 13 wherein said display means includes means for displaying an indication of the type of external analog signal applied to said analog input terminal.

15. A converter circuit according to claim 13 wherein said converter circuit includes internal reference signal means for producing a reference signal and wherein said sensing means senses a differential between said reference signal and said external analog signal applied to said analog input terminal.

16. A converter circuit according to claim 15 including switching means for disconnecting said reference signal means when the magnitude of said external analog signal applied to said analog input terminal exceeds the magnitude of said reference signal.

17. A converter circuit according to claim 13 wherein said encoding means encodes said converter circuit in a first manner when said sensing means senses said external analog signal having a magnitude exceeding the magnitude of said reference signal and in a second manner when said sensing means does not sense said external analog signal having a magnitude exceeding the magnitude of said reference signal.

18. A converter circuit according to claim 13 including a positive temperature coefficient resistor connected between said analog input terminal and said sensing means.

19. A converter circuit for providing analog-to-digital conversion comprising:
   an analog input terminal for receiving multiple types of external analog signals;
   digital output means for outputting digital signals proportional to said external analog signals;
   display means for displaying said digital signals;
   internal reference signal means for producing a reference signal;
   sensing means for sensing a differential between said reference signal and said external analog signal, said sensing means providing a first logic signal when the magnitude of said external analog signal applied to said analog input terminal exceeds the magnitude of said reference signal and is a DC signal, a second logic signal when the magnitude of said external analog signal exceeds the magnitude of said reference signal and is an AC signal, and a third logic signal when the magnitude of said external analog signal does not exceed the magnitude of said reference signal; and
   encoding means responsive to said logic signals for providing encoding signals to said converter circuit and causing said converter circuit to be encoded to respond to the type of said external analog signal applied to said analog input terminal and causing said display means to display an output proportional to the external analog signal.

20. A converter circuit according to claim 19 wherein said converter circuit causes said display means to display DC voltage in response to said first logic signal, and to display AC voltage in response to said second logic signal, and to display an impedance parameter in response to said third logic signal.

21. A converter circuit according to claim 19 including switching means associated with said sensing means, wherein said switching means when in a first condition causing said sensing means to provide said third logic signal when the magnitude of said external analog signal does not exceed the magnitude of said reference signal and when in a second condition causing said sensing means to provide a fourth logic signal when the magnitude of said external analog signal does not exceed the magnitude of said reference signal.

22. A converter circuit according to claim 21 including a positive temperature coefficient resistor connected between said analog input terminal and said internal reference signal means.

23. A converter circuit according to claim 22 comprising a digital multimeter wherein said display means displays a DC voltage responsive to said first logic signal, AC voltage responsive to said second logic signal, and resistance responsive to said third logic signal.

24. A converter circuit according to claim 22 wherein said display means exhibits a diode test display responsive to said fourth logic signal.

* * * * *